United States Patent
Bhat et al.

(10) Patent No.: US 6,891,197 B2
(45) Date of Patent: May 10, 2005

(54) SEMICONDUCTOR LED FLIP-CHIP WITH DIELECTRIC COATING ON THE MESA

(75) Inventors: Jerome C. Bhat, San Francisco, CA (US); Michael J. Ludowise, San Jose, CA (US); Daniel A. Steigerwald, Cupertino, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 79 days.

(21) Appl. No.: 10/461,173

(22) Filed: Jun. 12, 2003

(65) Prior Publication Data

US 2003/0205712 A1 Nov. 6, 2003

Related U.S. Application Data

(63) Continuation of application No. 09/852,857, filed on May 9, 2001, now Pat. No. 6,630,689.

(51) Int. Cl.[7] .......................... H01L 27/15; H01L 31/12; H01L 33/00
(52) U.S. Cl. ............................................ 257/79; 257/99
(58) Field of Search ........................... 257/13, 79–103, 257/104, 183, 190, 200, 668, 676, 693, 701, 918

(56) References Cited

U.S. PATENT DOCUMENTS

| | | | |
|---|---|---|---|
| 5,055,893 A | 10/1991 | Sasagawa | 357/17 |
| 5,448,114 A | 9/1995 | Kondoh et al. | 257/778 |
| 5,563,422 A | 10/1996 | Nakamura et al. | 257/13 |
| 5,625,202 A | 4/1997 | Chai | 257/94 |
| 5,710,441 A | 1/1998 | Ackley et al. | 257/98 |
| 5,739,554 A | 4/1998 | Edmond et al. | 257/103 |
| 5,903,589 A | 5/1999 | Jewell | 372/46 |
| 5,972,731 A | 10/1999 | Dutta | 438/39 |
| 6,298,079 B1 | 10/2001 | Tanaka et al. | 372/46 |
| 6,455,878 B1 | 9/2002 | Bhat et al. | 257/99 |
| 6,630,689 B2 * | 10/2003 | Bhat et al. | 257/79 |

FOREIGN PATENT DOCUMENTS

| | | |
|---|---|---|
| JP | 5160437 | 6/1993 |
| JP | 11-150298 | 6/1999 |
| JP | 2000031540 | 1/2000 |

* cited by examiner

Primary Examiner—Mary Wilczeweki
Assistant Examiner—Monica Lewis
(74) Attorney, Agent, or Firm—Patent Law Group LLP; Rachel V. Leiterman

(57) ABSTRACT

A dielectric layer is formed on the mesa wall of a flip-chip LED. The dielectric layer is selected to maximize reflection of light incident at angles ranging from 10 degrees towards the substrate to 30 degrees away from the substrate. In some embodiments, the LED is a III-nitride device with a p-contact containing silver, the dielectric layer adjacent to the mesa wall is a material with a low refractive index compared to GaN, such as $Al_2O_3$.

14 Claims, 5 Drawing Sheets

SEMICONDUCTOR LED FLIP-CHIP WITH DIELECTRIC COATING ON THE MESA

CROSS REFERENCE TO RELATED APPLICATION

This application is a continuation of application Ser. No. 09/852,857, filed May 9, 2001 now U.S. Pat. No. 6,630,689 and incorporated herein by reference.

BACKGROUND

Semiconductor light-emitting diodes (LEDs) are among the most efficient light sources currently available. Materials systems currently of interest in the manufacture of high-brightness LEDs capable of operation across the visible spectrum include Group III–V semiconductors, particularly binary, ternary, and quaternary alloys of gallium, aluminum, indium, and nitrogen, also referred to as III-nitride materials. Typically, III-nitride devices are epitaxially grown on sapphire, silicon carbide, or III-nitride substrates by metal-organic chemical vapor deposition (MOCVD), molecular beam epitaxy (MBE), or other epitaxial techniques. Some of these substrates are insulating or poorly conducting. Devices fabricated from semiconductor crystals grown on such substrates must have both the positive and the negative polarity electrical contacts to the epitaxially-grown semiconductor on the same side of the device. In contrast, semiconductor devices grown on conducting substrates can be fabricated such that one electrical contact is formed on the epitaxially grown material and the other electrical contact is formed on the substrate. However, devices fabricated on conducting substrates may also be designed to have both contacts on the same side of the device on which the epitaxial material is grown in a flip-chip geometry so as to improve light extraction from LED chip, to improve the current-carrying capacity of the chip, or to improve the heat-sinking of the LED die.

In order to fabricate efficient LED devices, the contacts must be electrically isolated from each other such that electrical carriers of the appropriate polarity are injected into the p-type and n-type sides of the semiconductor junction, where they recombine to produce light. FIG. 1 illustrates a typical III-nitride LED device. Semiconductor layers, including, for example, n-layer 12, active region 13, and p-layer 14 are epitaxially grown on substrate 11. P-contact 15 and n-contact 17 are formed on the same side of the device as described above. Electrical isolation between the p-contact 15 and the n-contact 17 is achieved by etching a mesa structure 18 into the device extending from the topmost layer down into the underlying n-layer and forming separate, defined p-contact 15 and n-contact 17. The LED is mounted to a submount assembly 22, which typically includes a submount on which the LED is mounted with solder bumps. The solder bumps create a gap between the submount and the LED. The connected LED and submount assembly are then typically encapsulated in a high index of refraction gel or epoxy.

The high index gel or epoxy is selected to match the index of refraction of the sapphire substrate as closely as possible, since the light produced in the device is extracted through the sapphire substrate. When light is incident on an interface between two materials, the difference in index of refraction determines how much light is reflected at that interface, and how much light is transmitted through it. The larger the difference in index of refraction, the more light is reflected. Thus, the small difference between the index of refraction of the sapphire substrate and the high index gel encapsulating the device ensures that most of the light generated in the device that reaches the emitting surfaces of the sapphire substrate is extracted from the device.

Photons are generated efficiently within active region 13, but extracting the photons from the semiconductor into the LED package and to the outside world is difficult, in part due to the high indices of refraction of the semiconductor layers. See, for example, Windisch et al., Applied Physics Letters, vol. 74, no. 16, p2256 (1999). Photons generated within the epitaxial semiconductor are incident upon either the interface between the semiconductor and substrate 11, the interface at mesa wall 18 between the semiconductor and the high index gel in submount assembly 22, or the interface between the semiconductor and the metal contacts. Photons incident on any of the three interfaces face a step in material refractive index. Such a step in refractive index causes a ray 20 incident on such an interface to be split into a transmitted portion 20a and a reflected portion 20b. Light transmitted out from mesa wall 18 (i.e. portion 20a) cannot be directed out of the device in a useful direction, thus light lost through transmission at mesa wall 18 contributes to the low light extraction efficiency of semiconductor LEDs.

The high index gel encapsulating the device results in a small difference in refractive index at the interface at mesa wall 18 between the semiconductor area between the contacts and the submount assembly. As a result, much of the light incident on this area is transmitted in the direction of the submount assembly, which causes significant optical loss. As described above, light extracted in this area towards the submount assembly cannot be usefully extracted from the package; rather, it is incident on the submount where it is absorbed. The device area between the contacts on a device such as that shown in FIG. 1 is estimated at 10% of the total area. This area includes the mesa wall and a small portion of semiconductor material parallel to the substrate and between the edge of each contact and the mesa wall. Methods of reducing such losses include the use of wafer fabrication techniques such as self-aligned metalization and tightened manufacturing tolerances to reduce the area between the contacts parallel to the substrate. Such wafer fabrication techniques may result in other problems such as increased reliability problems and difficulty in manufacturing. In addition, wafer fabrication techniques do not significantly reduce losses, since 3-D optical ray trace modeling of high index gel-encapsulated, III-nitride LED structures grown on sapphire shows that, of the light undesirably extracted from the LED chip in this direction, the majority is lost through the mesa wall rather than from any surface of the epitaxial material which runs parallel to the substrate surface on which the epitaxial semiconductor was grown. The light extracted at the mesa wall is on the order of 15% of the light generated within the LED, the exact figure depending on, among other factors, the mesa wall height and angle.

As light propagates through the device, it is subject to attenuation. Attenuation can occur at all places within the semiconductor, but is likely to be largest at the interfaces, for example between the semiconductor and the substrate; between the semiconductor and the contacts; in the active region; and in any nucleation layer present between the first semiconductor layer and the substrate. The further light propagates, the more it is attenuated. Light rays travelling through the semiconductor with a large angle $\beta$, the angle of propagation relative to the substrate, will require a longer path length to travel a given distance in the semiconductor resolved parallel to the substrate, compared with light rays with a small angle $\beta$. Each time a ray is reflected, the sign of the angle of propagation is reversed. For example, a ray propagating at angle β will propagate at an angle −β upon reflection. Large angle β rays will pass a greater number of times through the active region and will be reflected off the various interfaces (and especially at the semiconductor/p-contact interface and at the semiconductor/substrate) a greater number of times. Each time the ray is reflected, it becomes more attenuated. Such rays will therefore be subject to greater attenuation per unit distance of propagation in the x-direction than rays travelling at shallower angles β. Thus, most of the flux (optical power) incident on the mesa wall is incident on the mesa wall at shallow angles β.

FIG. 2 illustrates a model of flux distribution on the mesa wall as a function of propagation angle β. For a device with some absorption in the contacts, e.g. a device with an aluminum p-contact, 70% or more of the total flux incident on the mesa is incident at an angle −10 degrees<β<30 degrees. For an ideal device, i.e. a device with a highly reflective p-contact such as a pure silver p-contact, the proportion of flux incident on the mesa wall within this same angular range falls to about 60%.

Accordingly, an LED structure which minimizes loss at the mesa wall, particularly for light incident at angles between −10 and 30 degrees relative to the substrate, is needed.

SUMMARY

In one embodiment of the present invention, a dielectric layer is formed on the mesa wall of a flip-chip LED. The dielectric layer is selected to maximize reflection of light incident at angles ranging from 10 degrees towards the substrate to 30 degrees away from the substrate. In some embodiments, the LED is a III-nitride device with a p-contact containing silver, the dielectric layer adjacent to the mesa wall is a material with a low refractive index compared to GaN, such as $Al_2O_3$.

DETAILED DESCRIPTION

According to the present invention, the mesa wall of a flip chip LED is coated with a highly-reflective (HR) dielectric stack of alternating layers of two or more dielectric materials of differing refractive indices. The HR stack reduces the light lost through the mesa wall by reflecting and thereby redirecting a larger portion of the guided light within the LED chip which is incident on the coated mesa wall such that the light may be usefully extracted from the LED through the substrate. The use of an HR stack on the mesa wall improves extraction efficiency from LED flip-chips with minimal added complexity to the chip design and fabrication.

Figure 1:
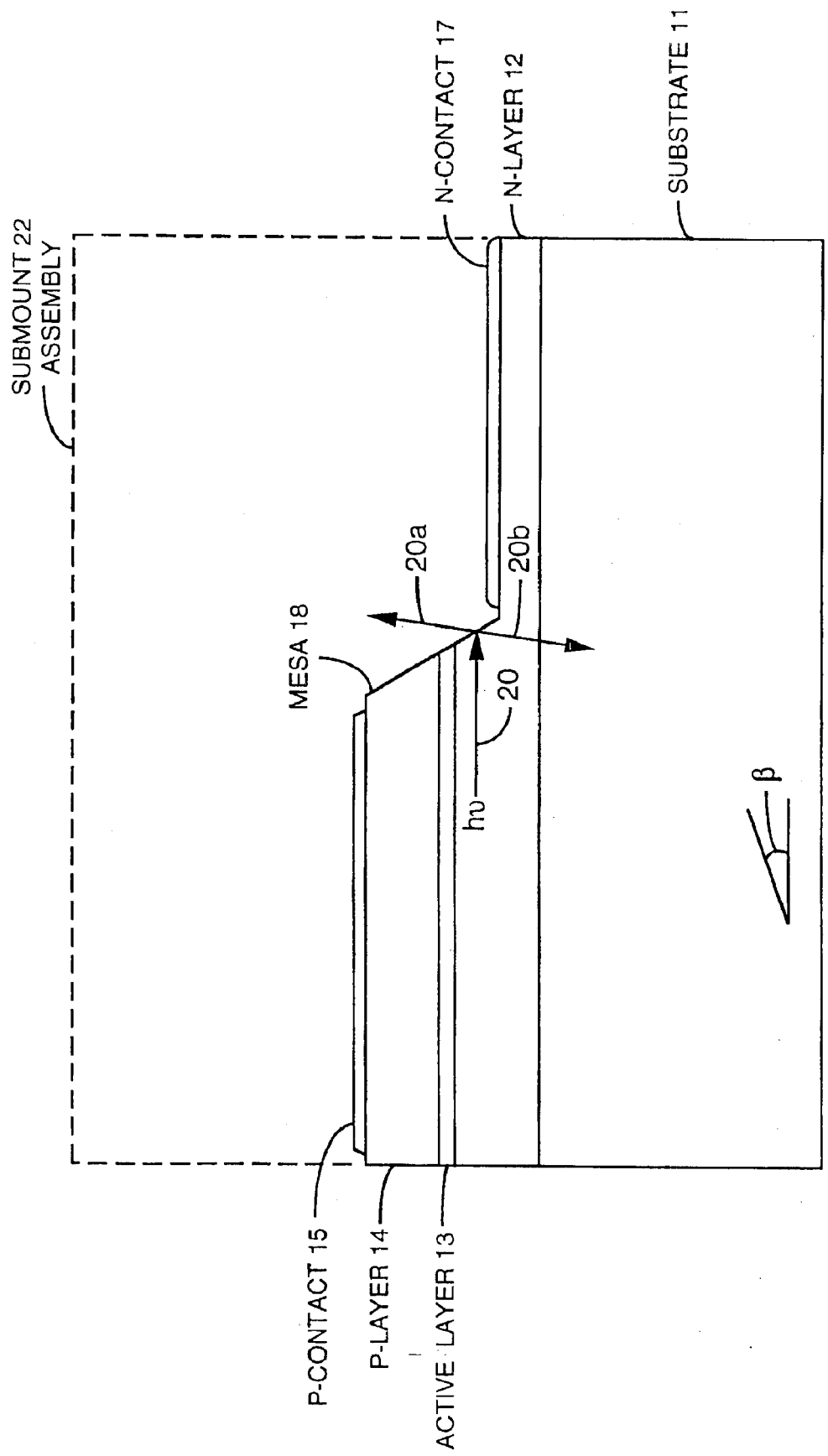
FIG. 1 illustrates a flip-chip light emitting diode.
Figure 2:
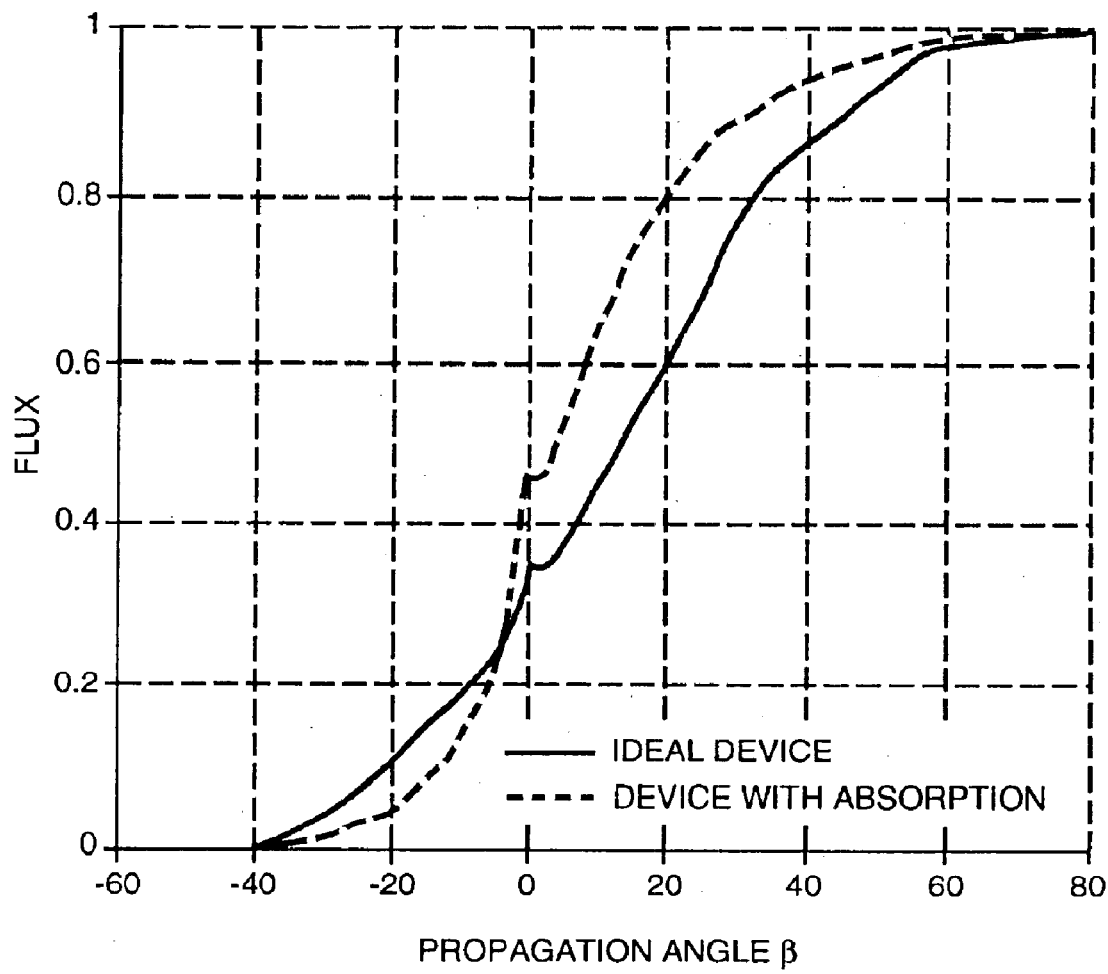
FIG. 2 illustrates optical flux on the mesa wall of a flip chip LED modeled as a function of propagation angle.
Figure 3A:
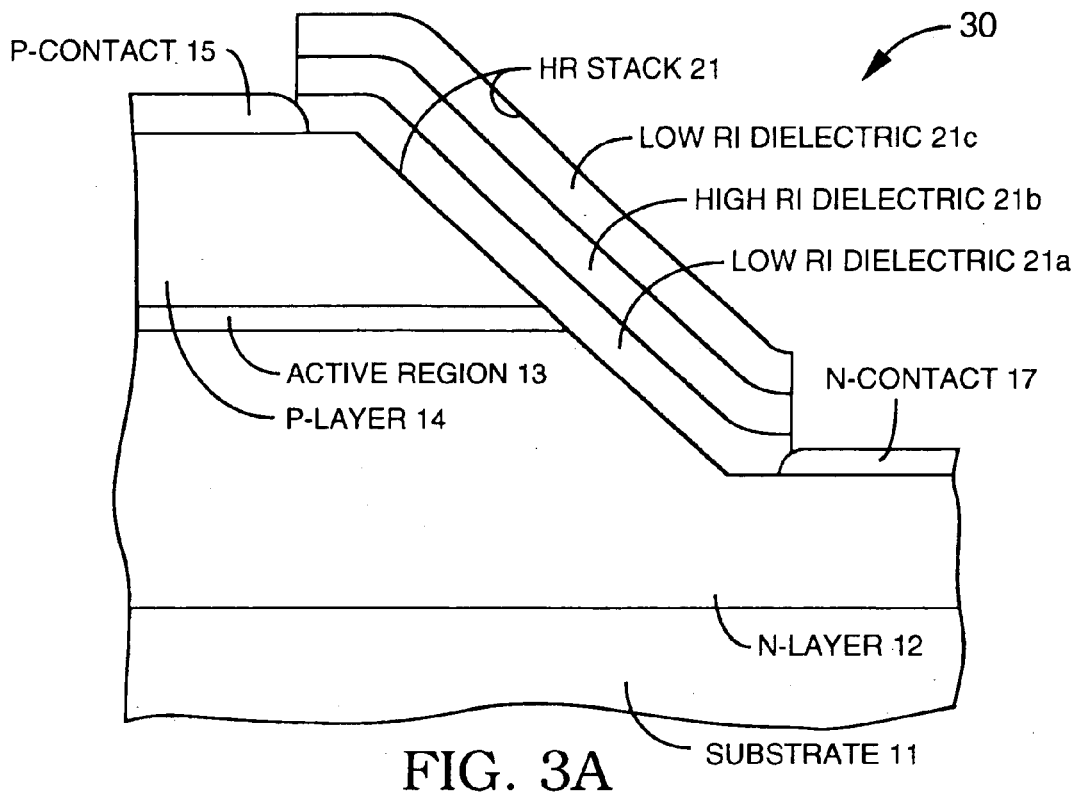
FIG. 3A illustrates a highly reflective dielectric stack formed on an LED mesa wall, according to a first embodiment of the present invention.

FIG. 3A illustrates one embodiment of the present invention. An HR stack 21 is formed over the mesa wall separating p-contact 15 from n-contact 17. The mesa wall is typically formed at an angle of about 35 to 55 degrees to the plane of the substrate. HR stack 21 includes several discrete dielectric layers. HR stack 21 alternates between dielectric layers of low refractive index (layers 21a and 21c) compared to the semiconductor layers 12, 13, and 14 and dielectric layers of high refractive index (layer 21b) compared to the low refractive index layers. High refractive index layers generally have an index of refraction greater than 2.1, typically ranging from 2.1 to 2.7. Low refractive index generally have an index of refraction less than 1.8, typically between about 1.35 and 1.8. Materials having an index of refraction between 1.8 and 2.1 can be used as either high refractive index layers or low refractive index layers, depending on the composition of the other materials used in the HR stack. The layers are selected to create a difference in refractive index designed to maximize reflection of light incident on the HR stack. In one embodiment, semiconductor layers 12, 13, and 14 are III-nitride materials, which have a high refractive index. Thus, dielectric layer 21a, the HR stack layer adjacent to semiconductor layers 12, 13, and 14, has a low refractive index. As a result of the alternating low and high refractive index materials, the HR stack is highly reflective of light incident on the mesa wall.

HR stack layers 21 are selected and arranged to provide maximum reflectivity for light rays incident on the mesa wall at angles to the substrate surface ranging from −10 to 30 degrees. Low refractive index (RI) layers 21a, 21c are, for example, oxides, nitrides, and oxy-nitrides of silicon; aluminum oxides; fluorides of lithium, calcium and magnesium; and other materials containing these materials alloyed or doped with other materials. High RI layers 21b are, for example, oxides of titanium, zirconium, tantalum, and manganese; zinc sulfide; III-nitride materials having an index of refraction higher than about 2.1; and other materials based on these dielectrics and doped with other materials. Layers which could be considered as being either high or low refractive index layers are, for example, oxides of hafnium, tin, or antimony; III-nitride materials having a refractive index lower than about 2.1; and other materials containing these materials alloyed or doped with other materials. Table 1 illustrates the refractive indices of exemplary semiconductor layers, low refractive index layers, and high refractive index layers.

TABLE 1

| Type of Layer | Material | Refractive Index |
|---|---|---|
| Semiconductor | GaN | 2.4 |
| Low RI | Aluminum Oxides | 1.60–1.77 |
| | Silicon Oxides | 1.41–1.55 |
| | Calcium Fluoride | 1.43 |
| | Magnesium Fluoride | 1.39 |
| | Barium Fluoride | 1.3 |
| | Cryolite ($Na_3AlF_6$) | 1.35 |
| | Cerium Fluoride | 1.63 |
| | Lanthanum Fluoride | 1.59 |
| | Lead Fluoride | 1.75 |
| | Neodium Fluoride | 1.61 |
| | Thorium Fluoride | 1.52 |
| | Yttrium Fluoride | 1.5 |
| | Tungsten Oxide | 1.7 |
| High RI | Titanium Oxides | 2.49–2.90 |
| | Zirconium Oxides | 2.13–2.20 |
| | Manganese Oxide | 2.46 |
| | Zinc Sulfide | 2.36 |
| | Chromium Oxide | 2.5 |
| | Zinc Selenide | 2.58 |
| | Niobium Oxide | 2.3 |
| | Indium Oxide | >2.2 |
| | Tantalum Oxide | 2.1 |

TABLE 1-continued

| Type of Layer | Material | Refractive Index |
|---|---|---|
| Either High RI or Low RI | Tin Oxide | 2 |
| | Aluminum Nitride | 2.0 |
| | Antimony Oxide | 2.1 |
| | Yttrium Oxide | 1.85 |
| | Silicon Monoxide | 1.8–1.9 |
| | Cerium Oxide | 1.95 |
| | Hafnium Oxide | 1.9 |

In some embodiments, the individual layers of HR stack 21 have a thickness of $$\frac{n\lambda}{4}\sqrt{\frac{1}{2}}$$

where λ is the wavelength of the propagating light in the particular layer, and n is any odd integer. Embodiments where n is equal to 1, 3, 5, or 7 are the simplest to manufacture, though n can be any odd integer. The wavelength is a function of the refractive index of the layer material, given by:

$$\lambda = \frac{(RI)c}{f}$$

where RI is the refractive index of the material, c is the velocity of light in a vacuum, and f is the frequency of the light. Light of a given frequency will have a different wavelength in the various semiconductor layers, in air, and in the various dielectric layers, all of which have a different refractive index.

In some embodiments, the individual layers of HR stack 21 have a thickness of $$\frac{n\lambda\sin\theta}{4}$$

where θ is the angle between the mesa wall and the substrate.

In order for the HR stack to act as an HR stack, rays 31b, 32b, 33b all have to interfere constructively at material interface 21a->14, If they interfere destructively the stack becomes anti-reflecting rather than HR. The layer thicknesses described above allow constructive interference to occur.

Figure 4:
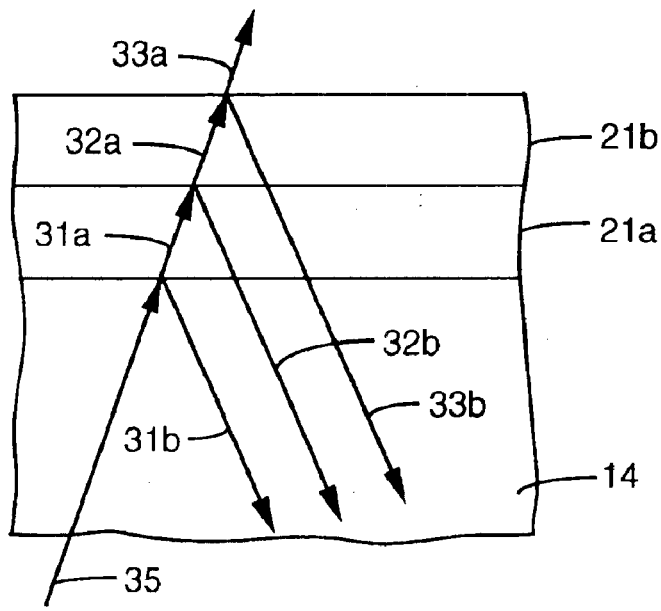
FIG. 4 illustrates the path of a light ray through a highly reflective dielectric stack deposited on the mesa wall of a flip chip LED.

FIG. 4 illustrates a simplified path of a light ray 35 through two layers of HR stack 21. Ray 35 passes through semiconductor layer 14 and is incident on dielectric layer 21a. The step in refractive index between semiconductor layer 14 and dielectric layer 21a causes a portion 31a of ray 35 to be transmitted through dielectric layer 21a and a portion 31b to be reflected. The transmitted portion 31a travels through dielectric layer 21a and is incident on dielectric layer 21b. The step in refractive index between dielectric layer 21a and dielectric layer 21b causes a portion 32a of ray 31a to be transmitted and a portion 32b to be reflected. When transmitted portion 32a is incident on the next interface, once again a portion 33a is transmitted and a portion 33b is reflected. As illustrated in FIG. 4, HR stack 21 reflects part of ray 35 (i.e. rays 31b, 32b, and 33b) back into semiconductor layer 14, where the light may be usefully extracted. Only a small part of ray 35, (i.e. ray 33a) is lost in a direction where it cannot be usefully extracted.

Typically, LED 30 is a flip-chip device, formed on a SiC, sapphire, or III-nitride substrate. P-contact 15 may be silver, a highly-reflecting silver alloy, a multilayer stack of metals including silver, or any other suitable non-silver contact. In embodiments where the p-contact contains silver, the low RI layers, including the HR stack layer in contact with the epitaxial layers, are typically aluminum oxide which enhances device reliability by suppressing migration of the silver into or across other layers of the device during device operation, thereby reducing the risk of short circuiting between the p- and n-contacts or across the p-n junction. In embodiments where the p-contact contains silver, low RI layers which include oxides of silicon are avoided, because the presence of such oxides can enhance silver migration during device operation.

Figure 3B:
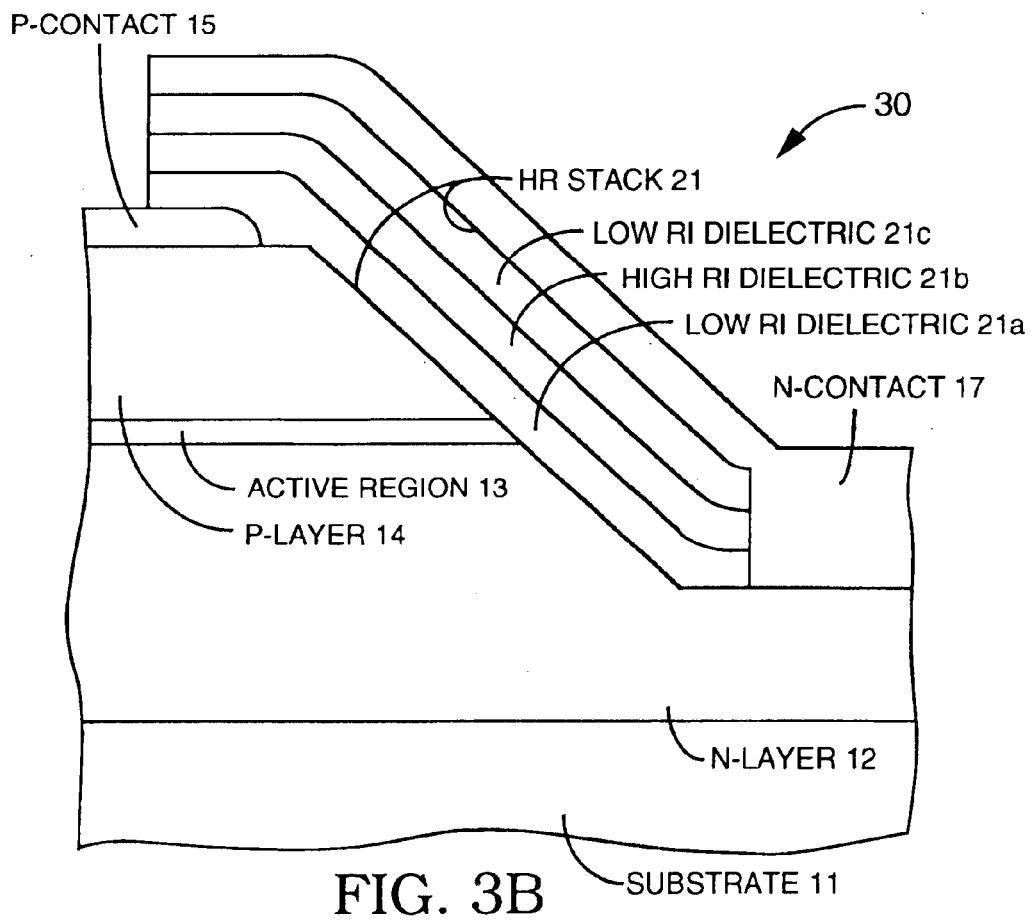
FIG. 3B illustrates a highly reflective dielectric stack formed on an LED mesa wall with a metal overlying the dielectric stack, according to a second embodiment of the present invention.

In some embodiments, such as that illustrated in FIG. 3B, the top layer of HR stack 21 is a reflective metal, though HR stack 21 does not require a metal as the top layer in order to be reflective. The top reflective metal layer may form part of the p- or n-contact and may be overlapped with the other contact to increase the current carrying capacity of the selected contact. In FIG. 3B, the n-contact 17 overlays the HR stack. A portion of the n-contact, on the left hand side of FIG. 3B, overlays a portion of p-contact 15. Such embodiments require that at least one dielectric layer of high quality be deposited in HR stack 21 such that the dielectric layer prevents short-circuiting between the overlying portions of the p- and n-contacts over the lifetime of the device.

Figure 5A:
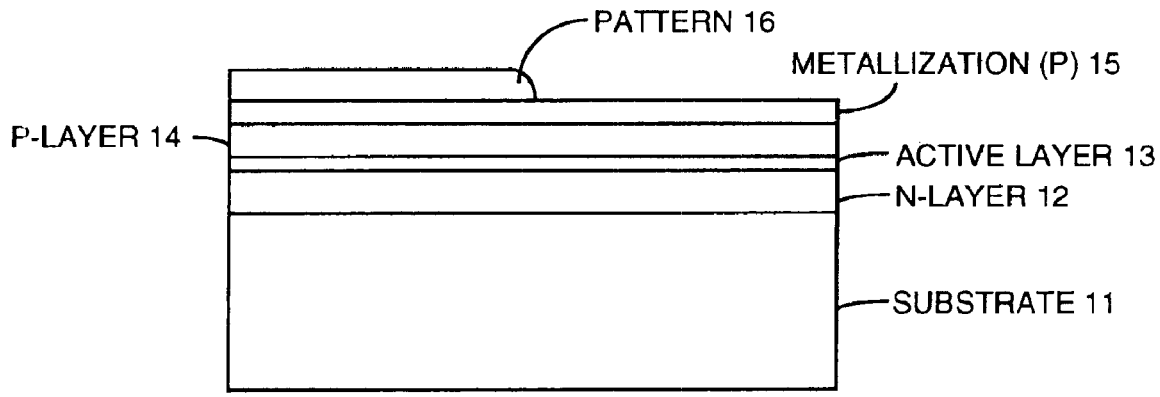
FIGS. 5A–5D illustrate an embodiment of the present invention at various stages in fabrication.

FIGS. 5A through 5D illustrate the fabrication of an LED according to an embodiment of the present invention. Referring to FIG. 5A, a substrate 11, such as SiC, sapphire, III-nitride, or any other suitable substrate is polished on one or both sides, then prepared with various cleans. GaN-based semiconductor layers are then grown on the substrate. The substrate is placed in a reactor and precursor gases, such as tri-methyl gallium and ammonia, are introduced which react to form epitaxial GaN at surface of the substrate. Other gases such as trimethyl indium or trimethyl aluminum are added to form layers 13 and 14. Metalization 15, which will later form the p-contact, is then deposited over the entire surface of the semiconductor layers, and a photoresist 16 is deposited in the areas where the p-contact metalization is to remain. Metalization 15 may be, for example, silver, nickel oxide/gold, nickel/gold covered with a thin reflective layer of aluminum, or any other suitable p-contact metal. Pattern 16 may be, for example, a positive or negative photoresist.

Figure 5B:
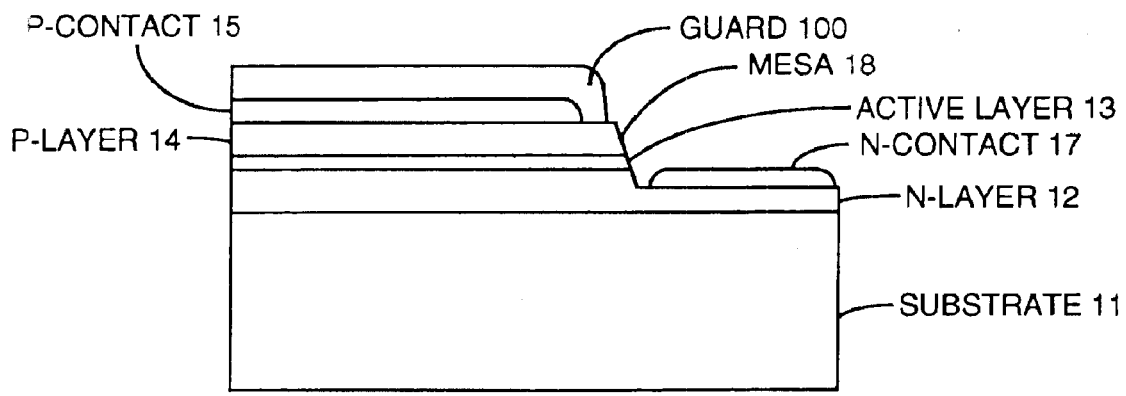

In FIG. 5B, the portion of metalization layer 15, p-layer 14, active layer 13, and n-layer 12 not covered by pattern 16 is etched away using, for example, a reactive ion etch. Other etches, such as wet etches, may be used. An etching step forms mesa wall 18 on which the HR stack is formed. The angle of the mesa wall can be controlled by the type of etch used to expose n-layer 12. A reactive ion etch forms a mesa wall with an angle of about 35 to 55 degrees between the mesa wall and the substrate. Modifying the etch chemistry and etch conditions changes the angle of the mesa wall.

If a silver p-contact is used, a thin diffusion barrier 100 of TiW, TiWN, or any other suitable material may be placed over the silver to prevent migration of silver into other areas of the device. The composition of the diffusion barrier layers is selected to optimize electrical conductivity and effectiveness as a barrier to silver migration. As the amount of nitrogen in the guard sheet increases, the diffusion barrier becomes less conductive but a better barrier to silver migration. Further, if a silver p-contact is used, a thin adhesion layer may be deposited between the silver and the semiconductor, to improve adhesion of the silver to the semiconductor. The adhesion layer may be, for example, Ni, Co, or Ti.

After etching the mesa wall, a metal layer which will eventually form the n-contact is deposited, then patterned and removed to form n-contact 17 on the exposed portion of n-layer 12. N-contact 17 may be, for example, aluminum.

Figure 5C:
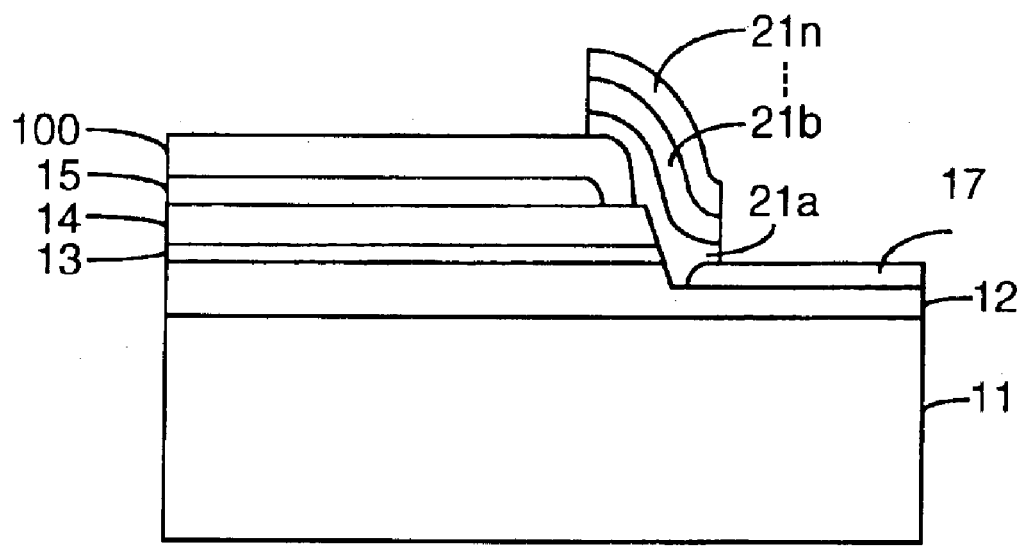

The HR stack is then formed on the mesa wall as illustrated in FIG. 5C. Each dielectric layer of the HR stack is deposited as a conformal layer, then the portion of the HR stack over p-contact 15 and n-contact 17 is etched away such that the HR stack only covers mesa wall 18.

Figure 5D:
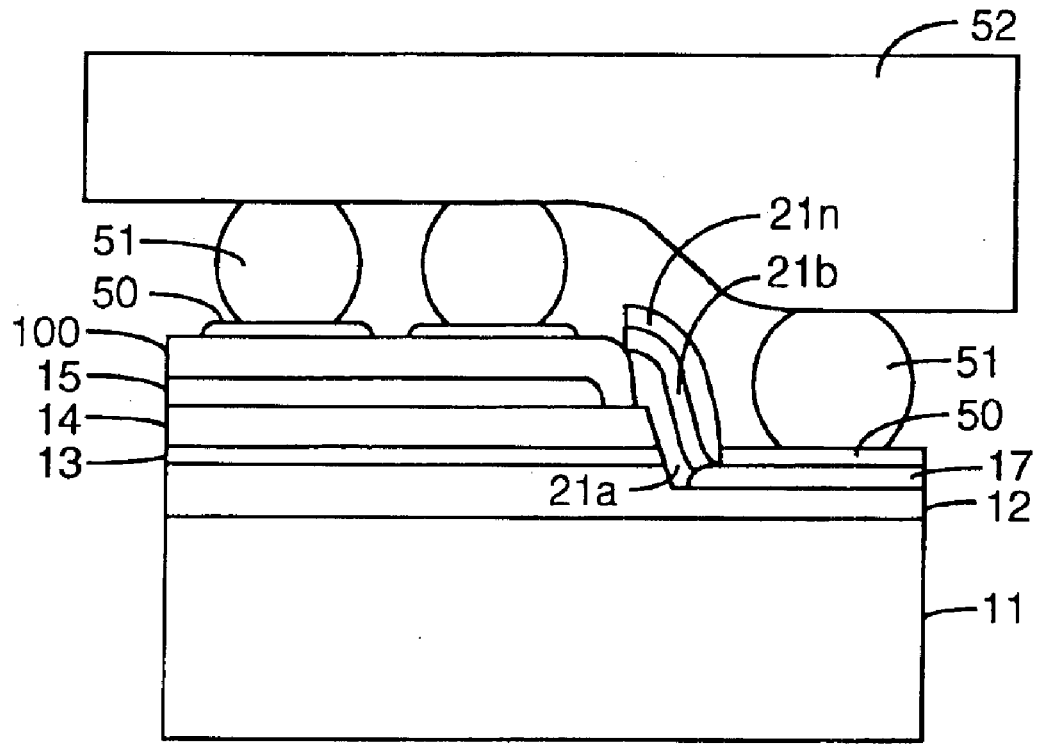

The device is then mounted on a substrate, as illustrated in FIG. 5D. A solder bump pattern is formed by depositing a wettable metal 50 on the areas on p-contact 15 and n-contact 17 which are to receive solder bumps. A submount 52 is then connected to the device by solder bumps 51. The solder contact provides electrical contact to the LED and sinks heat produced by the LED away from the chip.

The present invention offers several advantages. An HR stack on the mesa of a flip-chip device is simple to fabricate and provides increased light extraction in a useful direction. In addition, unlike other types of reflective mesa coatings, an HR stack can be designed for high reflectivity for light at specific incident angles. For example, metal layers or dielectric/metal bilayers attached to the mesa can provide high reflectivity over a wide range of angles of incidence. However, in the case of the LED flip-chip described above, a large fraction of the flux incident on the mesa is incident within a reasonably narrow range of angles ($\beta$ from −10 to +30 degrees). An HR stack can be designed to have a reflectivity higher than of a metal or dielectric/metal bilayer over a selected range of angles of incidence. See, for example, Thin Film Optical Coatings by H. A. McLeod.

While particular embodiments of the present invention have been shown and described, it will be obvious to those skilled in the art that changes and modifications may be made without departing from the invention in its broader aspects and, therefore, the appended claims are to encompass within their scope all such changes and modifications as fall within the true spirit and scope of this invention. For example, the invention is not limited to a GaN-based device as described above. Further, the metals and dielectrics can be defined by lift-off processes, rather than by the etching described above. Also, the mesa (the active, the p, and part of the underlying n) does not have to be etched away, but can alternatively be selectively grown.

We claim:

1. A light emitting device comprising:
   an n-type layer;
   an active region overlying the n-type layer;
   a p-type layer overlying the active region;
   an n-contact connected to the n-type layer;
   a p-contact comprising silver and connected to the p-type layer, wherein the n-contact and the p-contact are formed on the same side of the device and the n-contact is electrically isolated from the p-contact by a mesa wall; and
   a dielectric layer formed on the mesa wall.

2. The light emitting device of claim 1, wherein the n-type layer, the active region, and the p-type layer are III-nitride materials.

3. The light emitting device of claim 1 wherein an angle between the mesa wall and the substrate is about 35 degrees to 55 degrees.

4. The light emitting device of claim 1 wherein the dielectric layer is reflective of light emitted by the active region.

5. The light emitting device of claim 1 further comprising a metal layer overlying the dielectric layer, wherein the metal layer is connected to one of the p-contact and the n-contact.

6. The light emitting device of claim 1 wherein the dielectric layer has a refractive index less than a refractive index of any of the n-type layer, the p-type layer, and the active region.

7. The light emitting device of claim 1 wherein the dielectric layer has a refractive index less than about 1.8.

8. The light emitting device of claim 1 wherein the dielectric layer is selected from a group consisting of oxides of silicon, nitrides of silicon, oxy-nitrides of silicon, aluminum oxides, fluorides of lithium, fluorides of calcium, and fluorides of magnesium.

9. The light emitting device of claim 1 wherein the dielectric layer has a refractive index less than 2.1.

10. The light emitting device of claim 1 wherein the dielectric layer is selected from a group consisting of tin oxide, aluminum nitride, antimony oxide, yttrium oxide, silicon monoxide, cerium oxide, and hafnium oxide.

11. The light emitting device of claim 1 wherein a thickness of the dielectric layer is about equal to $$\frac{n\lambda}{4}\sqrt{\frac{1}{2}}$$

wherein n is an odd integer and $\lambda$ is a wavelength of light in the dielectric layer.

12. The light emitting device of claim 1 wherein a thickness of the dielectric layer is about equal to $$\frac{n\lambda\sin\theta}{4}$$

wherein n is an odd integer, $\lambda$ is a wavelength of light in the dielectric layer, and $\theta$ is a measure of an angle between the mesa wall and the substrate.

13. The light emitting device of claim 1 wherein a composition and a thickness of the dielectric layer are selected to maximize reflection of light incident on the mesa wall at angles of propagation ranging from 10 degrees towards the substrate to 30 degrees away from the substrate.

14. The light emitting device of claim 1 wherein the dielectric layer comprises an aluminum oxide.

* * * * *